(12) United States Patent
Leibfritz et al.

(10) Patent No.: US 10,514,436 B2
(45) Date of Patent: Dec. 24, 2019

(54) TEST DEVICE, REMOTE MEASUREMENT MODULE AND TEST METHOD

(71) Applicant: Rohde & Schwarz GmbH & Co. KG, München (DE)

(72) Inventors: Martin Leibfritz, Aying (DE); Werner Held, Pocking (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/449,668

(22) Filed: Mar. 3, 2017

(65) Prior Publication Data
US 2018/0252791 A1 Sep. 6, 2018

(51) Int. Cl.
| | |
|---|---|
| G01R 31/319 | (2006.01) |
| G01R 35/00 | (2006.01) |
| G01R 27/28 | (2006.01) |
| H04B 17/21 | (2015.01) |
| H04B 17/11 | (2015.01) |
| G01R 27/32 | (2006.01) |

(52) U.S. Cl.
CPC ........... *G01R 35/005* (2013.01); *G01R 27/32* (2013.01)

(58) Field of Classification Search
CPC .. G01R 31/3191; G01R 35/005; G01R 27/28; H04B 17/21; H04B 17/11
See application file for complete search history.

(56) References Cited

U.S. PATENT DOCUMENTS

| | | | | |
|---|---|---|---|---|
| 4,827,437 | A * | 5/1989 | Blanton | G01R 31/3191 702/89 |
| 7,357,814 | B2 * | 4/2008 | Gabbay | A61B 5/1076 33/551 |
| 2007/0236230 | A1 * | 10/2007 | Tanbakuchi | G01R 27/28 324/650 |
| 2015/0168530 | A1 * | 6/2015 | Mende | G01R 35/005 324/96 |
| 2015/0212129 | A1 * | 7/2015 | Chayat | G01R 27/32 324/638 |
| 2017/0111127 | A1 * | 4/2017 | VanWiggeren | H04B 17/15 |
| 2017/0146632 | A1 * | 5/2017 | Wadell | G01R 1/07342 |

* cited by examiner

*Primary Examiner* — Neel D Shah
(74) *Attorney, Agent, or Firm* — Shumaker & Sieffert, P.A.

(57) ABSTRACT

A test device for testing an electronic device under test comprises a remote measurement module configured to capture signals originating from the electronic device under test and output the captured signals, and an analysis device configured to receive the captured signals and to calibrate the test device based on test signals provided by the analysis device and the captured signals.

17 Claims, 4 Drawing Sheets

TEST DEVICE, REMOTE MEASUREMENT MODULE AND TEST METHOD

TECHNICAL FIELD

The present invention relates to a test device. The present invention further relates to a remote measurement module and a test method.

BACKGROUND

Although applicable in principal to any system that measures electrical signals, the present invention and its underlying problem will be hereinafter described in combination with vector network analyzers.

Modern electronic devices may comprise a plurality of high frequency elements and handle data and analogue signals at frequencies of up to several GHz.

In order to verify compliance of such electronic devices with legal regulations and standards, extensive testing of these devices is necessary during development, production, and in the field.

Vector network analyzers may be used to perform in depth analysis of such modern electronic devices.

The problem addressed by the present invention is to provide network analyzers with increased frequency ratings.

SUMMARY

The present invention solves this object by a test device with the features of claim 1, a remote measurement module with the features of claim 10, and a test method with the features of claim 15.

Accordingly it is provided:

A test device for testing an electronic device under test, the test device comprising a remote measurement module configured to capture, measure or detect signals originating from the electronic device under test and output the captured signals, and an analysis device, like e.g. a vector network analyzer or NVA, configured to receive the captured signals and to calibrate the test device based on test signals provided by the analysis device and the captured signals.

Further it is provided:

A remote measurement module for testing an electronic device under test, the remote measurement module comprising a signal capturing unit configured capture signals originating from the electronic device under test, and a signal output port configured to output the captured signals.

Finally it is provided:

A test method for testing an electronic device under test with a test device, the test method comprising remotely capturing signals originating from the electronic device under test, outputting the remotely captured signals, and calibrating the test device based on provided test signals and the captured signals.

Modern analysis devices like e.g. vector network analyzers may perform measurements of an electronic device under test by providing a predefined test signal to the electronic device under test and measuring the signals reflected by the electronic device under test or the signals traveling through end exiting the electronic device under test. Comparing the incoming or incident (into the electronic device under test) signal and the reflected signal as well as the incoming signal and the outgoing signal allows calculating the so called S parameters of the electronic device under test.

Such modern analysis devices require calibration to perform with maximum precision. Such calibration may be performed with calibration standards prior to performing a measurement and periodically while a measurement is performed.

Performing calibration as well as performing a measurement requires the use of a directional coupler in the analysis device, which is capable of separating incident signals to the electronic device under test and signals reflected at the electronic device under test. The directional coupler should extract only the reflected signal parts.

Usually directional couplers comprise a raw directivity of about 30 dB. This means that incoming and reflected signals up to a signal difference of about 30 dB can be distinguished by the directional coupler.

The present invention is based on the finding that with modern electronic devices under test the frequencies of the test signals become higher. At such increased frequencies the attenuation of cables, which are needed in the test setup, may for the reflected signals reach the above mentioned 30 dB. Separating the incoming and the reflected signals in the analysis device may therefore become difficult.

The test device of the present invention takes into account this finding and provides the remote measurement module that measures signals originating at the electronic device under test, which may e.g. be the reflected signals. The remote measurement module may then provide the measured reflected signals directly to the analysis device.

This means that the measured reflected signals may e.g. be measured near the electronic device under test, where the reflected signals have not yet been attenuated e.g. by any long measurement cables.

If the captured signals are provided directly to the analysis device, they do not have to be separated from any incident signal any more in the analysis device, and may therefore be directly used to perform any calculations or measurements on the signals.

Summing up, with the present invention the reflected signals may be measured near their origin and without major attenuations of the signal path. Therefore the signals may be provided to the analysis device in separated form and may be treated separately in the analysis device without having to pass a directional coupler with limited directivity.

Further embodiments of the present invention are subject of the further subclaims and of the following description, referring to the drawings.

In a possible embodiment, the remote measurement module may be positioned at the electronic device under test and electrically coupled to the electronic device under test.

Positioned at the electronic device under test in this context refers to the remote measurement module being positioned close, e.g. as close as the test setup allows, to the electronic device under test. The remote measurement module may e.g. be positioned with the electronic device under test in a test chamber, like e.g. a thermo-vacuum chamber.

Therefore, the cables connecting the remote measurement module to the electronic device under test will be considerably shorter than the cables connecting the remote measurement module to the analysis device. The signals reflected in the electronic device under test may therefore be acquired in the remote measurement module with a considerably higher signal level than in the analysis device.

In a possible embodiment, the remote measurement module may comprise a directional element to separate reflected signals originating from the electronic device under test from signals provided to the electronic device under test by the analysis device.

Directional elements, like e.g. directional couplers, are well known and simple to manufacture elements that provide a high quality signal separation. As already stated above, directional couplers may comprise a raw directivity of up to 30 dB.

In a possible embodiment, the directional element may comprise an octave coupler. Octave couplers cover a specific limited bandwidth, are small and provide a good overall performance. By using such an octave coupler with limited bandwidth, the influence of noise or other interference may further be reduced.

In a possible embodiment, the analysis device may comprise a signal measurement element and a bypass port to bypass a directional coupler in the analysis device and provide the captured signals directly to the signal measurement element.

Usually a signal is generated in the analysis device and provided via a cable to the electronic device under test. The same cable then transports the reflected signal back to the analysis device. The directional element in the analysis device will then couple out the reflected signal and provide that signal to the signal measurement element.

However, if the signal is already coupled out at the remote measurement module, it is not necessary to feed the signal through the directional element again. Therefore, the directional element may be bypassed and the already coupled out reflected signal may be provided directly to the signal measurement element, which may e.g. comprise high-speed analogue-to-digital converters.

With this setup the limiting directivity of the directional element of about 30 dB is also bypassed and the sensitivity of the signal measurement element will become the dominating factor. The signal measurement element may e.g. comprise a sensitivity or dynamic range of up to 120 dB.

If for example a cable has a one way attenuation of about 15 dB in the relevant frequency range, a signal travelling round-trip on the same cable will suffer an attenuation of 30 dB. This signal may therefore not be correctly separated by a directional element any more.

If however the reflected signal is coupled out at the electronic device under test, i.e. after travelling only half the distance, the signal will have suffered an attenuation of only 15 dB. The directional element in the remote measurement module may therefore easily couple out the reflected signal and transmit that signal via a separate cable to the analysis device, especially directly to the signal measurement element.

It is understood, that the coupled out signal will also suffer attenuation on the separate cable. However, since there is no need to couple out the signal in the analysis device any more, the signal may be directly handled by the signal measurement element with its high dynamic range of up to 120 dB or more. A round-trip attenuation of 30 dB will therefore still provide a usable signal level of about 90 dB.

In a possible embodiment, the analysis device may be configured to calculate corrected error parameters by comparing the test signals provided by the analysis device and the captured signals and/or by comparing the test signals provided by the analysis device and reference calibration variables.

In a possible embodiment, the analysis device may be configured to calculate S-parameters for the electronic device under test by comparing the test signals provided by the analysis device and the captured signals.

The analysis device may use the reflected signal either to calculate corrected error parameters, i.e. to perform calibration of the test setup, or to calculate S-parameters of the electronic device under test, i.e. to perform a measurement on the electronic device under test.

The analysis device may e.g. perform the calculation of the corrected error parameters online during the measurement, e.g. by interleaving calibration test signals and measurement test signals. It is understood, that the analysis device may use any of a plurality of possible error models for performing the error correction for the test device, especially for the analysis device, e.g. for a vector network analyzer.

In a possible embodiment, the remote measurement module may comprise a power detector, e.g. a power measurement diode or a power meter, configured to measure the power of the signals originating from the electronic device under test and/or the test signals provided by the analysis device.

In a possible embodiment, the analysis device may be configured to monitor the test device based on the measured power of the signals originating from the electronic device under test and the test signals provided by the analysis device.

The relationship of the power level of the incident and the reflected signal is a known value for a specific test setup. A change of this relationship may therefore indicate a problem in the test setup. Therefore by monitoring the power levels a simple yet effective error detection may be performed.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
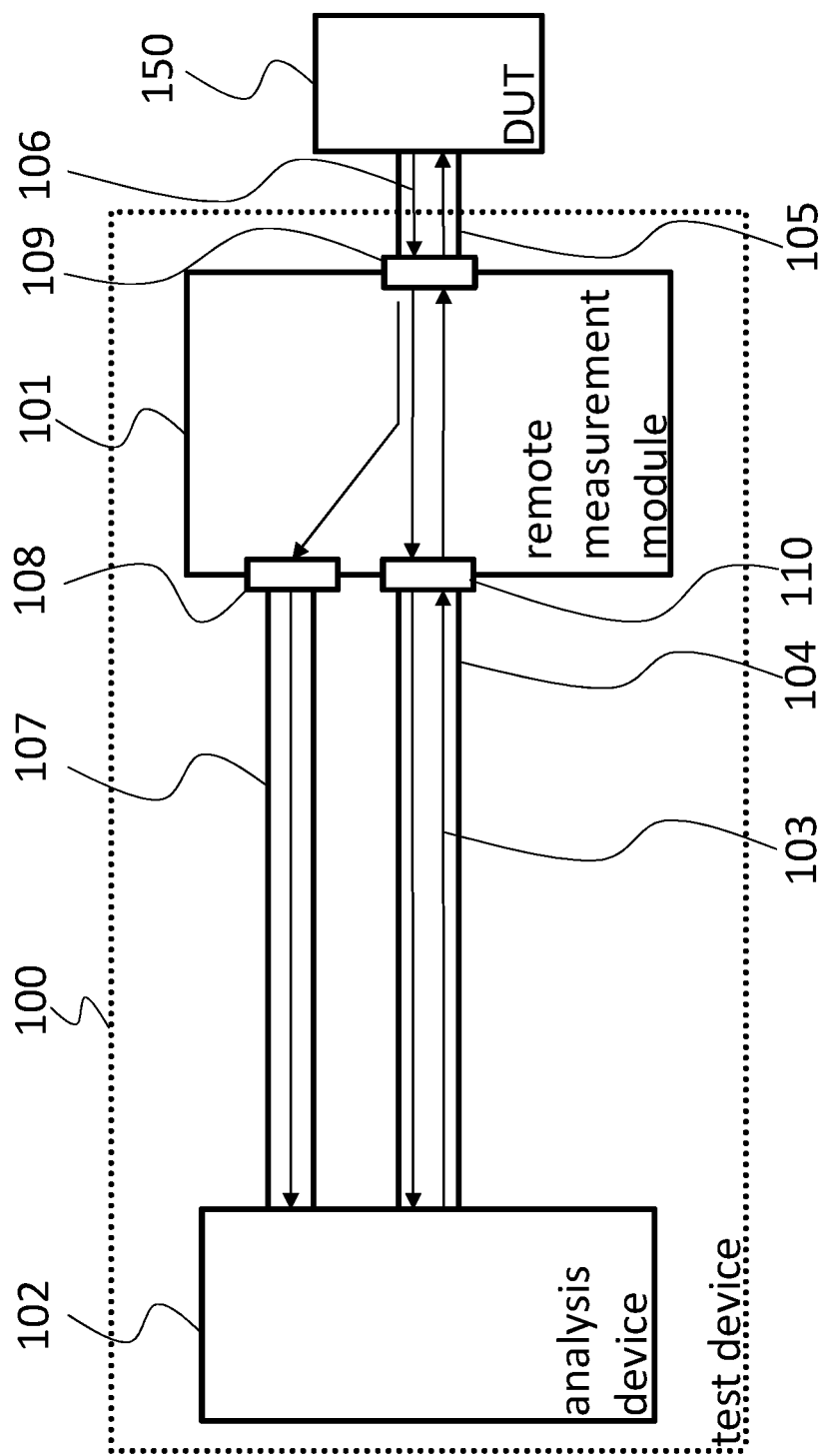
FIG. 1 shows a block diagram of an embodiment of a test device according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

FIG. 1 shows a block diagram of a test device 100. The test device 100 serves for testing an electronic device under test or DUT 150. Testing may e.g. comprise determining the S-parameters of the DUT 150 or performing any other possible measurement with the DUT 150.

The test device 100 comprises a remote measurement module 101 and an analysis device 102. The analysis device 102 may comprise any type of measurement or analysis device, like e.g. a network analyzer, especially a vector network analyzer or VNA. A VNA provides a predetermined test signal 103 to the DUT 150 and may measure the signal output of the DUT 150. Further, a VNA may also measure the reflected signal 106, i.e. the part of the test signal 103 that is reflected at or in the DUT 150 and transported back to the VNA over the cable 104, 105 that is used to provide the test signal 103 to the DUT 150. By measuring the reflected signal 106 the analysis device 102 may e.g. determine the S-parameters for the DUT 150. However, as already explained above, the cables 104, 105 may attenuate the reflected signal 106 such that it may not be correctly detected in the analysis device 102.

Therefore, the test device 100 provides the remote measurement module 101, which may be positioned near the DUT 150, such that the cable 105 may be as short as possible. Near in this context refers to the remote measurement module 101 being positioned such that the signal level of the reflected signal 106 is high enough at the remote measurement module 101 to capture, separate or couple out the reflected signal 106.

The remote measurement module 101 captures the reflected signal 106, or any other signal provided by the DUT 150, and transmits the captured reflected signal 106 directly to the analysis device 102.

With this arrangement of the test device 100 there is no need to separate the reflected signal 106 from the incident test signal 103. The already separated reflected signal 106 may therefore be directly used by the analysis device 102 to perform the respective measurements or calculations. The analysis device 102 may e.g. calculate the S-parameters for the DUT 150 or error parameters for the test setup, which may then be used in an error model to compensate for systematic errors in the test setup.

Figure 2:
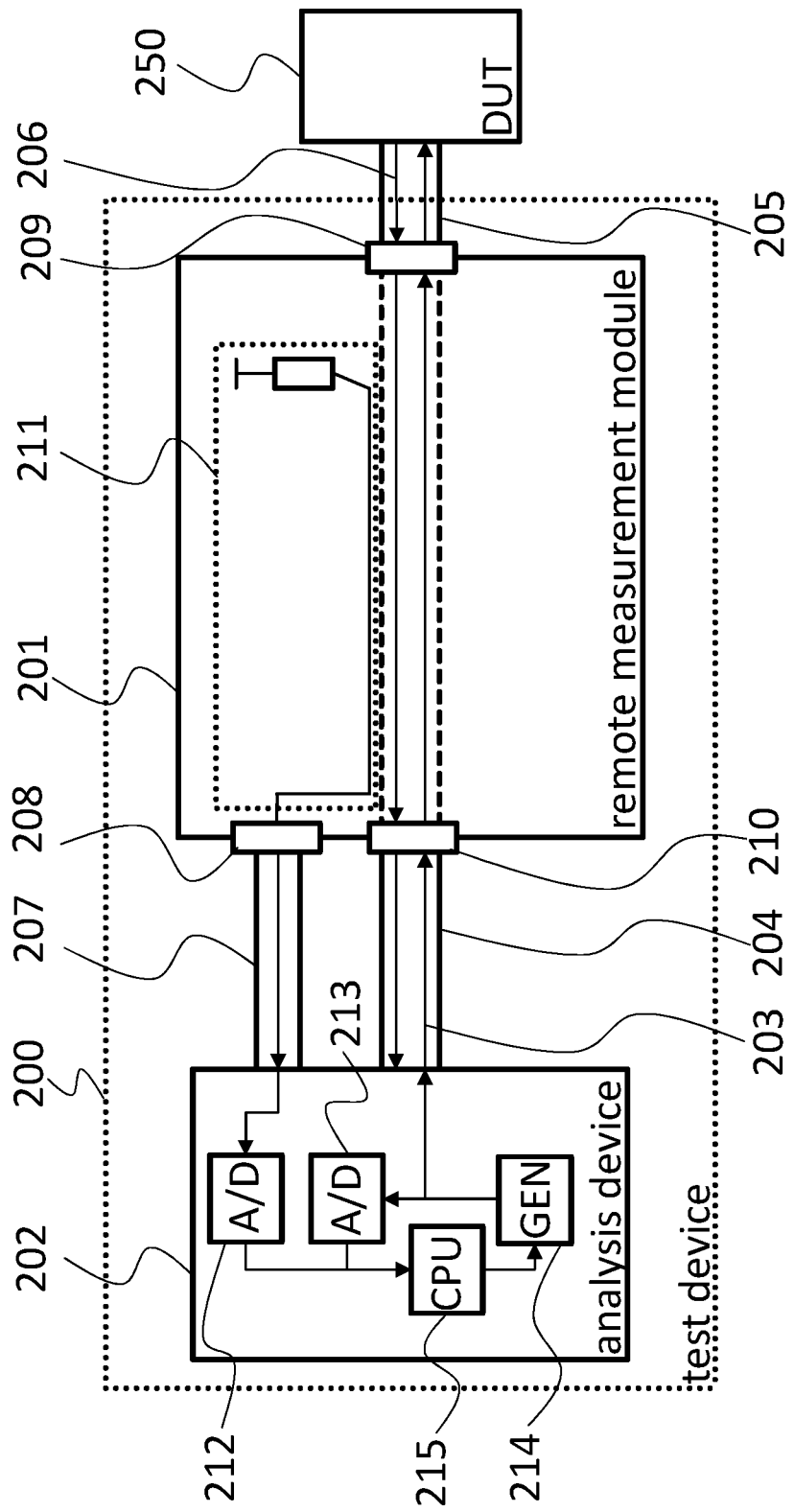
FIG. 2 shows a block diagram of another embodiment of a test device according to the present invention.

FIG. 2 shows a block diagram of another test device 200. The test device 200 is based on the test device 100.

In the test device 200 the remote measurement module 201 comprises a directional element 211, e.g. a directional coupler like an octave coupler that separates the reflected signal 206 from the test signal 203. The directional element 211 may e.g. comprise two coupled transmission lines that may be realized e.g. in coaxial or planar technology. A planar technology directional element 211 may e.g. be provided simply by forming the respective transmission lines on a PCB. The dimensions of the transmission lines may be adapted to the relevant frequency ranges.

In the test device 200 the reflected signal 206 is provided to the analysis device 202 via cable 207. The reflected signal 206 is then captured by a signal measurement element 212, which may e.g. be an analogue-to-digital converter or A/D-converter. The analysis device 202 comprises a further A/D-converter 213 for capturing the test signal 203.

A processing unit or CPU 215 is further provided to control a signal generator 214, which generated the test signal 203, and to analyze the captured signals 203 and 206 or to perform the required calculations over the captured signals 203 and 206.

The CPU 215 may be any type of CPU 215, e.g. a microcontroller 215, a CPU 215 embedded in an FPGA, an ASIC or the like. It is understood, that e.g. an FPGA may further accommodate the A/D-converters 212, 213 and the signal generator 214. It is understood, that any other necessary peripheral hardware, like e.g. clock sources, analogue filters or the like, may also be provided as required.

Figure 3:
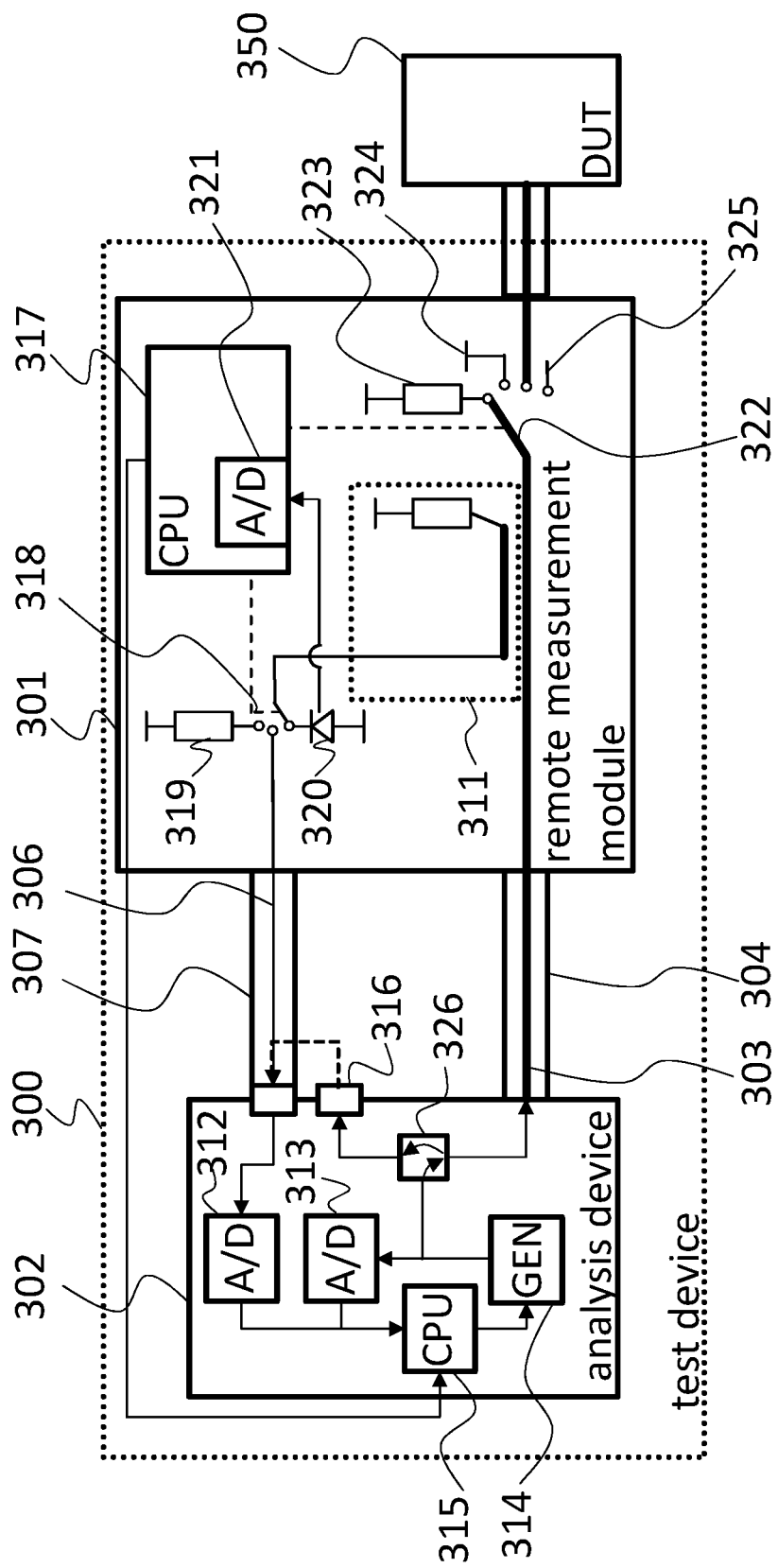
FIG. 3 shows a block diagram of another embodiment of a test device according to the present invention.

FIG. 3 shows a block diagram of a test device 300 that is based on the test device 200. The remote measurement module 301 of the test device 300 comprises two switches 318, 322, which serve to modify the signal paths in the remote measurement module 301.

Switch 318 is arranged in the signal line that transports the coupled out reflected signal 306. The switch 318 may be used to send the reflected signal 306 either to the analysis device 302, to a resistor 319 or to a power measurement device 320, e.g. a power measurement diode 320. With the switch 318 it is therefore possible to perform different functions in the remote measurement module 301. It is obvious that providing the reflected signal 306 directly to the analysis device 302 allows performing the above explained measurements.

Sending the reflected signal 306 to the power measurement diode 320 in contrast allows measuring the power level of the reflected signal 306. In the remote measurement module 301 a processor 317 with an A/D-converter 321 may be provided to perform this power measurement. It is understood, that any other type of power measurement may also be performed.

The second switch 322 is provided in the main signal line, e.g. the signal line that transports the test signal 303 to the DUT 350. The switch 322 can connect the main signal line either to the DUT 350 to provide the test signal 303 to the DUT 350, or to a matched impedance 323, a ground connection 324 or an open terminal 325.

If the test signal 303 is routed to the ground connection 324 or the open terminal 325 the test signal 303 will be reflected with a predetermined characteristic without entering the DUT 350. This reflected test signal 303 may then also be coupled out by the directional element 311 and the power of the reflected test signal 303 may also be measured by the processor 317. The attenuation of the test signal from the point of reflection, i.e. the ground connection 324 or the open terminal 325, may be predetermined for the test setup and is therefore well known. The power level of the test signal 303 may therefore be calculated based on the respective measured power level and the known attenuation.

With the arrangement of the remote measurement module 301 it is therefore possible to measure the power level of the test signal 303 as it arrives at the remote measurement module 301. At the same time it is possible to measure the power level of the reflected signal 306 as it is reflected by the DUT 350.

The processor 317 may perform a monitoring of the test setup by monitoring the power levels of the test signal 303 and the reflected signal 306. As an alternative the processor 317 may simply forward the measured power levels to the processor 315 of the analysis device 302, which may then perform the monitoring.

It is understood, that the processor 315 of the analysis device 302 may control the processor 317 of the remote measurement module 301 to control the switches 318, 322 and to perform the power measurements.

The processor 315 may e.g. stop the signal generator 314 from generating the test signal 303 for the DUT 350 and command the signal generator 314 to generate specific power measurement signals that may then be captured by the processor 317.

The analysis device 302 further comprises a bypass port 316. In normal operation the bypass port 316 is closed or bridged, i.e. the reflected signal 306 is provided through the cable 304 to the analysis device 302 and via the directional coupler 326 and the bypass port 316 to the A/D-converter 312.

However, with the remote measurement module 301 in place, the directional coupler 326 with its limited directivity is not needed any more.

Instead, the bypass port 316 is opened, i.e. signals cannot pass from the directional coupler 326 to the A/D-converter 312. The reflected signal 306 is instead provided by the remote measurement module 301 directly to the A/D-converter 312 via cable 307.

The cable 307 will provide some attenuation to the reflected signal 306. In addition, the test signal 303 will also suffer the attenuation of the cable 304. The important difference with the remote measurement module 301 is however that the reflected signal 306 is coupled out at or near the DUT 350 and has not yet suffered the attenuation of the return path to the analysis device 302.

This means that the directional coupler 311 will receive the reflected signal 306 after it suffered only half the attenuation that is present in the reflected signal at the directional coupler 326. Directional couplers may e.g. comprise a directivity of about 30 dB. This means that a signal that suffered an attenuation of more than 30 dB cannot be coupled out by such a directional coupler.

Therefore, with increased attenuation the reflected signal 306 may be coupled out by the directional coupler 311, while it may not be coupled out by the directional coupler 326 anymore.

The A/D-converter 312 in contrast to the directional couplers 326, 311 may comprise a sensitivity or dynamic range of about 120 dB. This means that the A/D-converter 312 can sample signals with a dynamic range or signal level of up to 120 dB. If a signal suffers an attenuation of e.g. 30 dB the A/D-converter 312 still has 90 dB of dynamic range to sample the respective signal.

The signal path of the reflected signal 306 may increase the signal to noise ratio, SNR. However, this may be acceptable or may be compensated by other means.

The test device 300 may be a PC-based test device 300, e.g. with FPGA extension boards or the like, an embedded system or any other adequate electronic device. It is understood, that although not shown, the test device 300 may comprise a memory for storing measurement and configuration data. Further, the test device 300 may comprise communication interfaces, like e.g. an Ethernet interface, to couple the test device 300 to further test systems, data or configuration servers and exchange respective measurement or configuration data.

In addition, the test device 300 may comprise a display and user inputs that may allow to use the test device 300 as a standalone test device 300.

For sake of clarity the reference signs used above regarding the apparatus-based figures will also be used below in the description of the method-based figure.

Figure 4:
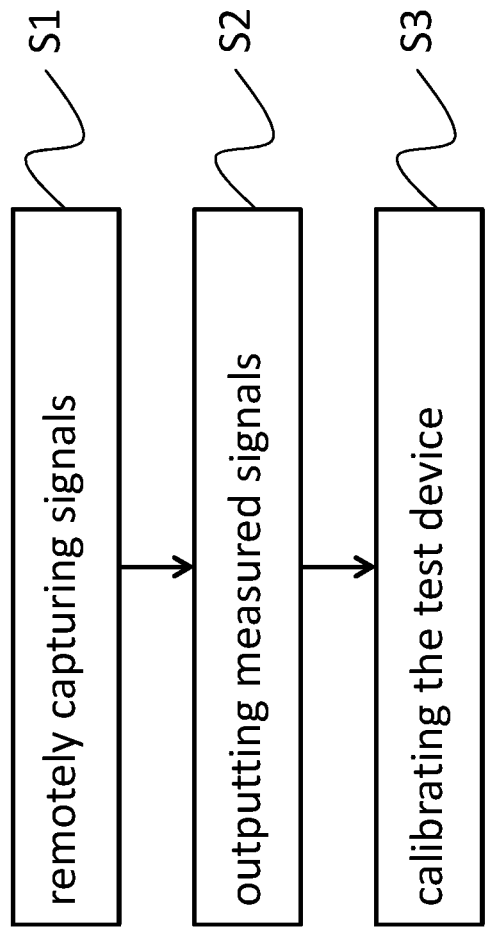
FIG. 4 shows a flow diagram of an embodiment of a test method according to the present invention.

FIG. 4 shows a flow diagram of a test method for testing an electronic device under test 150, 250, 350 with a test device 100, 200, 300.

The test method comprises remotely capturing S1 signals 106, 206, 306 originating from the electronic device under test 150, 250, 350. Remotely capturing S1 may e.g. be performed at the electronic device under test 150, 250, 350.

Remotely capturing S1 may e.g. comprise separating reflected signals 106, 206, 306 originating at the electronic device under test 150, 250, 350 from the original test signals 103, 203, 303 provided to the electronic device under test 150, 250, 350. The reflected signals 106, 206, 306 may e.g. be coupled out or separated with a directional element, like e.g. an octave coupler.

The remotely measured or captured signals 106, 206, 306 are then output S2 e.g. to an analysis device 102, 202, 302.

The test device 100, 200, 300 is calibrated S3 based on provided test signals 103, 203, 303 and the captured signals 106, 206, 306.

When providing the captured or reflected signals 106, 206, 306 a directional coupler 326 in an analysis device 102, 202, 302 may be bypassed and the captured signals 106, 206, 306 may be provided directly to a signal measurement element 212, 312 of the analysis device 102, 202, 302.

Calibrating the test device 100, 200, 300 may comprise calculating corrected error parameters by comparing the test signals 103, 203, 303 provided to the electronic device under test 150, 250, 350 and the captured signals 106, 206, 306 and/or by comparing the test signals 103, 203, 303 provided to the electronic device under test 150, 250, 350 and reference calibration variables.

In addition, the test method may further comprise performing measurements on the electronic device under test 150, 250, 350, e.g. calculating S-parameters for the electronic device under test 150, 250, 350, by comparing the test signals 103, 203, 303 provided to the electronic device under test 150, 250, 350 and the captured signals 106, 206, 306.

Further, the test method may comprise remotely measuring the power of the signals 106, 206, 306 originating from the electronic device under test 150, 250, 350 and/or the test signals 103, 203, 303 provided to the electronic device under test 150, 250, 350. And monitoring the test device 100, 200, 300 based on the measured power of the signals 106, 206, 306 originating from the electronic device under test 150, 250, 350 and the test signals 103, 203, 303 provided to the electronic device under test 150, 250, 350.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A test device for testing an electronic device under test, the test device comprising a remote measurement module and a processing unit implemented in circuitry, the processing unit comprising an analysis device, wherein:
   the remote measurement module is configured to capture signals originating from the electronic device under test and output the captured signals directly to the analysis device, wherein the remote measurement module is positioned near the electronic device under test and electrically coupled to the electronic device under test,
   the analysis device configured to receive the captured signals and to calibrate the test device based on test signals provided by the analysis device and the captured signals, wherein to calibrate the test device, the analysis device is configured to calculate corrected error parameters by comparing the test signals provided by the analysis device and the captured signals wherein the signals are treated separately in the analysis device, and
   wherein the remote measurement device comprises a switch, the switch is configured to send a part of the test signal that is reflected at or in the electronic device under test to either the analysis device, to a resistor or to a power measurement device.

2. The test device according to claim 1, wherein the remote measurement module comprises a directional element to separate reflected signals originating from the electronic device under test from signals provided to the electronic device under test by the analysis device.

3. The test device according to claim 2, wherein the directional element comprises an octave coupler.

4. The test device according to claim 1, wherein the analysis device comprises a signal measurement element and a bypass port to bypass a directional coupler in the analysis device and provide the captured signals directly to the signal measurement element.

5. The test device according to claim 1, wherein the analysis device is configured to calculate S-parameters for the electronic device under test by comparing the test signals provided by the analysis device and the captured signals.

6. The test device according to claim 1, wherein the remote measurement module comprises a power detector configured to measure the power levels of the signals originating from the electronic device under test and/or the test signals provided by the analysis device.

7. The test device according to claim 6, wherein the analysis device is configured to monitor the test device based on the measured power levels of the signals originating from the electronic device under test and the test signals provided by the analysis device.

8. A remote measurement module for testing an electronic device under test, the remote measurement module comprising a signal capturing unit and a signal output port and a switch, wherein:
   the signal capturing unit is configured capture signals originating from the electronic device under test, wherein the signal capturing unit comprises a directional element to separate reflected signals originating from the electronic device under test from signals provided to the electronic device under test by the analysis device,
   the signal output port is configured to output the captured signals directly to the analysis device,
   the remote measurement module is positioned near the electronic device under test and is electrically coupled to the electronic device under test, and
   the switch is configured to send a part of the test signal that is reflected at or in the electronic device under test to either the analysis device, to a resistor or to a power measurement device.

9. The remote measurement module to claim 8, wherein the directional element comprises an octave coupler.

10. The remote measurement module according to claim 8, comprising a power detector configured to measure the power of the signals originating from the electronic device under test and/or the test signals provided by the analysis device.

11. A test method for testing an electronic device under test with a test device, the test method comprising:
   remotely capturing, by a remote measurement module, signals originating from the electronic device under test, wherein remotely capturing is performed near the electronic device under test,
   outputting, by the remote measurement module, the captured signals directly to an analysis device,
   sending a part of the test signal that is reflected at or in the electronic device under test to either the analysis device, to a resistor or to a power measurement device of the remote measurement module, and
   calibrating, by the analysis device, the test device based on provided test signals and the captured signals,
   wherein calibrating comprises calculating corrected error parameters by comparing the test signals provided to the electronic device under test and the captured signals, wherein the signals are treated separately in the analyzing device.

12. The test method according to claim 11, wherein remotely capturing comprises separating reflected signals originating from the electronic device under test from the test signals provided to the electronic device under test.

13. The test method according to claim 12, wherein separating reflected signals is performed with an octave coupler.

14. The test method according to claim 11, wherein calibrating comprises calculating corrected error parameters by comparing the test signals provided to the electronic device under test and the captured signals and/or by comparing the test signals provided to the electronic device under test and reference calibration variables.

15. The test method according to claim 11, further comprising calculating S-parameters for the electronic device under test by comparing the test signals provided to the electronic device under test and the captured signals.

16. The test method according to claim 11, further comprising remotely measuring the power levels of the signals originating from the electronic device under test and/or the test signals provided to the electronic device under test.

17. The test method according to claim 16, further comprising monitoring the test device based on the measured power levels of the signals originating from the electronic device under test and the test signals provided to the electronic device under test.

\* \* \* \* \*